US008001446B2

(12) United States Patent
Walma

(10) Patent No.: US 8,001,446 B2
(45) Date of Patent: Aug. 16, 2011

(54) PIPELINED CYCLIC REDUNDANCY CHECK (CRC)

(75) Inventor: Mathys Walma, Hillsboro, OR (US)

(73) Assignee: Intel Corporation, Santa Clara, CA (US)

( * ) Notice: Subject to any disclaimer, the term of this patent is extended or adjusted under 35 U.S.C. 154(b) by 1114 days.

(21) Appl. No.: 11/728,367

(22) Filed: Mar. 26, 2007

(65) Prior Publication Data

US 2008/0244361 A1    Oct. 2, 2008

(51) Int. Cl.
    *H03M 13/00*    (2006.01)
(52) U.S. Cl. .................. 714/781; 714/758; 714/807
(58) Field of Classification Search .................. None
    See application file for complete search history.

(56) References Cited

U.S. PATENT DOCUMENTS

| 6,519,738 | B1 * | 2/2003 | Derby | 714/781 |
|---|---|---|---|---|
| 6,530,057 | B1 * | 3/2003 | Kimmitt | 714/758 |
| 6,662,336 | B1 * | 12/2003 | Zook | 714/786 |
| 6,964,008 | B1 * | 11/2005 | Van Meter, III | 714/807 |
| 7,577,055 | B2 * | 8/2009 | Ngo et al. | 365/230.08 |
| 2003/0159101 | A1 * | 8/2003 | Hyland et al. | 714/781 |
| 2008/0168323 | A1 * | 7/2008 | Clark et al. | 714/758 |

OTHER PUBLICATIONS

Braun, Florian et al., "Fast Incremental CRC Updates for IP over ATM Networks", *Department of Computer Science, Washington University in St. Louis*, florian,mwa@arl.wustl.edu, 6 pages.
Sprachmann, Michael, "Automatic Generation of Parallel CRC Circuits", *IEEE Design & Test of Computers*, (2001), pp. 108-114.
Satran, Julian et al., "Out of Order Incremental CRC Computation", *IBM Haifa Labs*, (Feb. 25, 2003), pp. 1-11.
Kounavis, Michael E., et al., "A Systematic Approach to Building High Performance, Sortware-based, CRC Generators", *IEEE International Symposium on Computers and Communications (ISCC 2005) in Cartagena, Spain*, Intel Research and Development, Hillsboro, OR, 97124, USA, (Jun. 2005), pp. 1-11.
Doering, Andreas et al., "Fast and Flexible CRC Calculation", Indexing terms: Cyclic Redundancy Check, Network processing, 4 pages.
Pei, Tong-Bi et al., "High-Speed Parallel CRC Circuits in VLSI", *IEEE Transactions on Communications*, vol. 40, No. 4, (Apr. 1992), pp. 653-657.
Campobello, Giuseppe et al., "Parallel CRC Realization", *IEEE Transactions on Computers*, vol. 52, No. 10, (Oct. 2003), pp. 1312-1319.
Monteiro, Fabrice et al., "A Fast CRC Implementation on FPGA Using a Pipelined Architecture for the Polynomial Division", (2001), pp. 1231-1234.
Borrelli, Chris "IEEE 802.3 Cyclic Redundancy Check", (Mar. 23, 2001), pp. 1-8.

* cited by examiner

*Primary Examiner* — Esaw T Abraham
(74) *Attorney, Agent, or Firm* — Caven & Aghevli LLC

(57) ABSTRACT

Methods and apparatus to provide a pipelined cyclic redundancy check (CRC) are described. In one embodiment, a plurality of stages determines a plurality of CRC values corresponding to portions of a data packet. The plurality of CRC values are accumulated to determine a CRC value for the data packet. Other embodiments are also described.

15 Claims, 4 Drawing Sheets

PIPELINED CYCLIC REDUNDANCY CHECK (CRC)

BACKGROUND

The present disclosure generally relates to the field of electronics. More particularly, an embodiment of the invention generally relates to a pipelined cyclic redundancy check.

Cyclic redundancy check (CRC) is a type of hash function that may be used to generate a checksum corresponding to a block of data, such as a communication packet. CRC may be used to detect data transmission errors. For example, a CRC value for a packet may be calculated prior to transmitting the packet and after the packet is received at a destination. These CRC values may be compared to detect data transmission errors.

To handle ever increasing data throughputs, wider data paths may be used in integrated circuit (IC) components. CRC may, however, be resistant to scaling to wider data paths. For example, some current implementations may use a linear feedback shift register (LFSR) to calculate a CRC value. In order to increase the parallelism, the serial implementation may be unrolled. Unrolling the serial implementation may, however, increase the worst case timing path. For example, the critical timing path delay may be increased with each doubling of the data width (and consequent doubling of area). Since the computed result may be fed back to compute the next value, the doubling in area may result in less than double the throughput.

BRIEF DESCRIPTION OF THE DRAWINGS

The detailed description is provided with reference to the accompanying figures. In the figures, the left-most digit(s) of a reference number identifies the figure in which the reference number first appears. The use of the same reference numbers in different figures indicates similar or identical items.

DETAILED DESCRIPTION

In the following description, numerous specific details are set forth in order to provide a thorough understanding of various embodiments. However, various embodiments of the invention may be practiced without the specific details. In other instances, well-known methods, procedures, components, and circuits have not been described in detail so as not to obscure the particular embodiments of the invention. Further, various aspects of embodiments of the invention may be performed using various means, such as integrated semiconductor circuits ("hardware"), computer-readable instructions organized into one or more programs ("software"), or some combination of hardware and software. For the purposes of this disclosure reference to "logic" shall mean either hardware, software, or some combination thereof.

Reference in the specification to "one embodiment" or "an embodiment" means that a particular feature, structure, or characteristic described in connection with the embodiment may be included in at least an implementation. The appearances of the phrase "in one embodiment" in various places in the specification may or may not be all referring to the same embodiment.

Also, in the description and claims, the terms "coupled" and "connected," along with their derivatives, may be used. In some embodiments of the invention, "connected" may be used to indicate that two or more elements are in direct physical or electrical contact with each other. "Coupled" may mean that two or more elements are in direct physical or electrical contact. However, "coupled" may also mean that two or more elements may not be in direct contact with each other, but may still cooperate or interact with each other.

Figure 1:
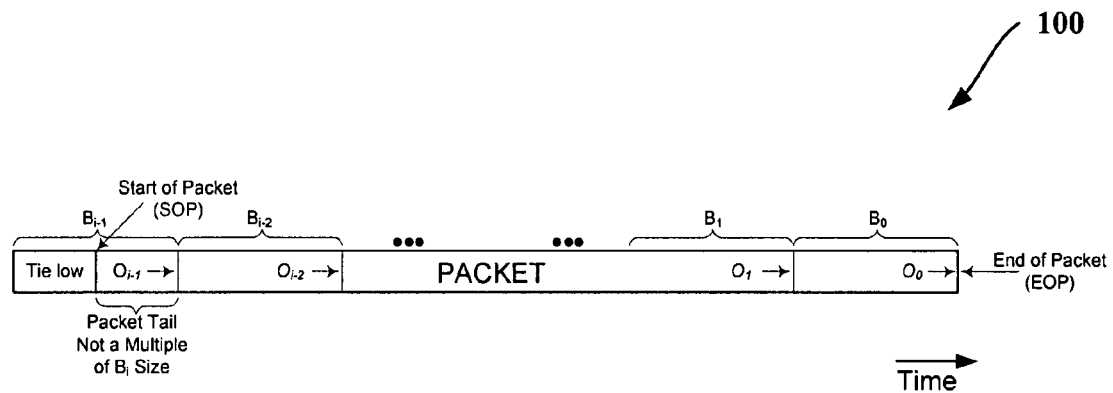
FIGS. 1 and 2 illustrate different ways to divide a data packet into portions, in accordance with some embodiments of the invention.
Figure 2:
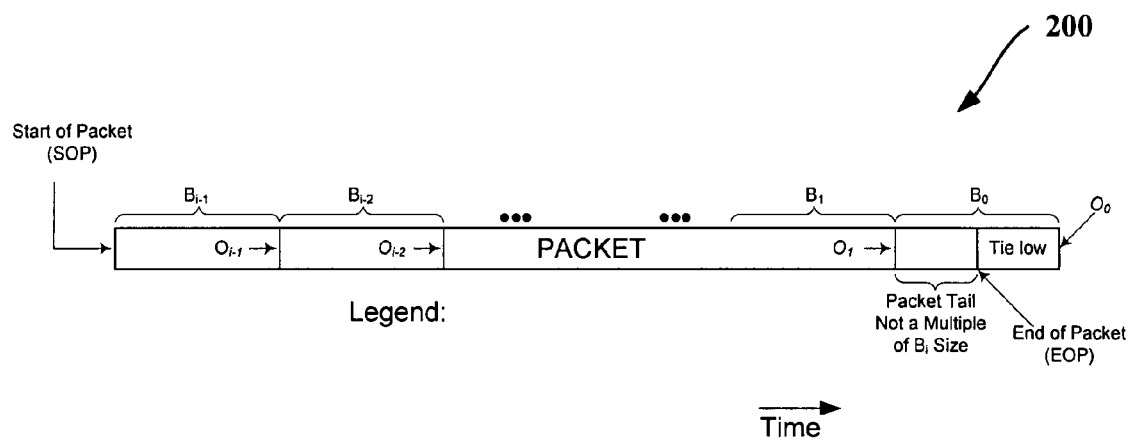

Some of the embodiments discussed herein may provide a pipelined CRC, such as discussed with reference to FIGS. 1-5. For example, a CRC value determined through a pipelined CRC at a transmit agent may be compared with a CRC value determined at a receiving agent through a pipelined CRC to detect communication errors. In accordance with an embodiment, a data packet may be divided into portions such that when the portions are XOR'ed together the original packet is obtained. More particularly, FIGS. 1 and 2 illustrate two ways to divide a data packet into portions, in accordance with some embodiments of the invention. In particular, packet 100 of FIG. 1 does not require modifying the final calculated CRC value, but may require knowing the packet size in advance. On the other hand, packet 200 of FIG. 2 may be used in situations where the final packet size is unknown in advance.

In one embodiment, the division may be performed in two stages which may be referred to as "prestage" and "after prestage" as will be further discussed herein, e.g., with reference to FIGS. 1-4. Moreover, a packet may be first divided into fixed sized blocks of bits called $B_i$. "O" may designate an offset into each of the blocks $B_i$. For example, $O_{i-1}$ may be the offset of $B_{i-1}$, which may be equal to the number of bits from $O_0$ in an embodiment. Also, $O_0$ may be the offset of $B_0$ which may be equal to 0 in one embodiment. The part of the packets 100 and 200 denoted as "Tie low" shows part of the Bi at either end of the packets where the bits may be set to zero in accordance with some embodiments. This may pad the packet length to render a packet that is a multiple of $B_i$ in length. Further details of various stages for a pipelined CRC in accordance with an embodiment of the invention will now be discussed with reference to FIG. 3.

Figure 3:
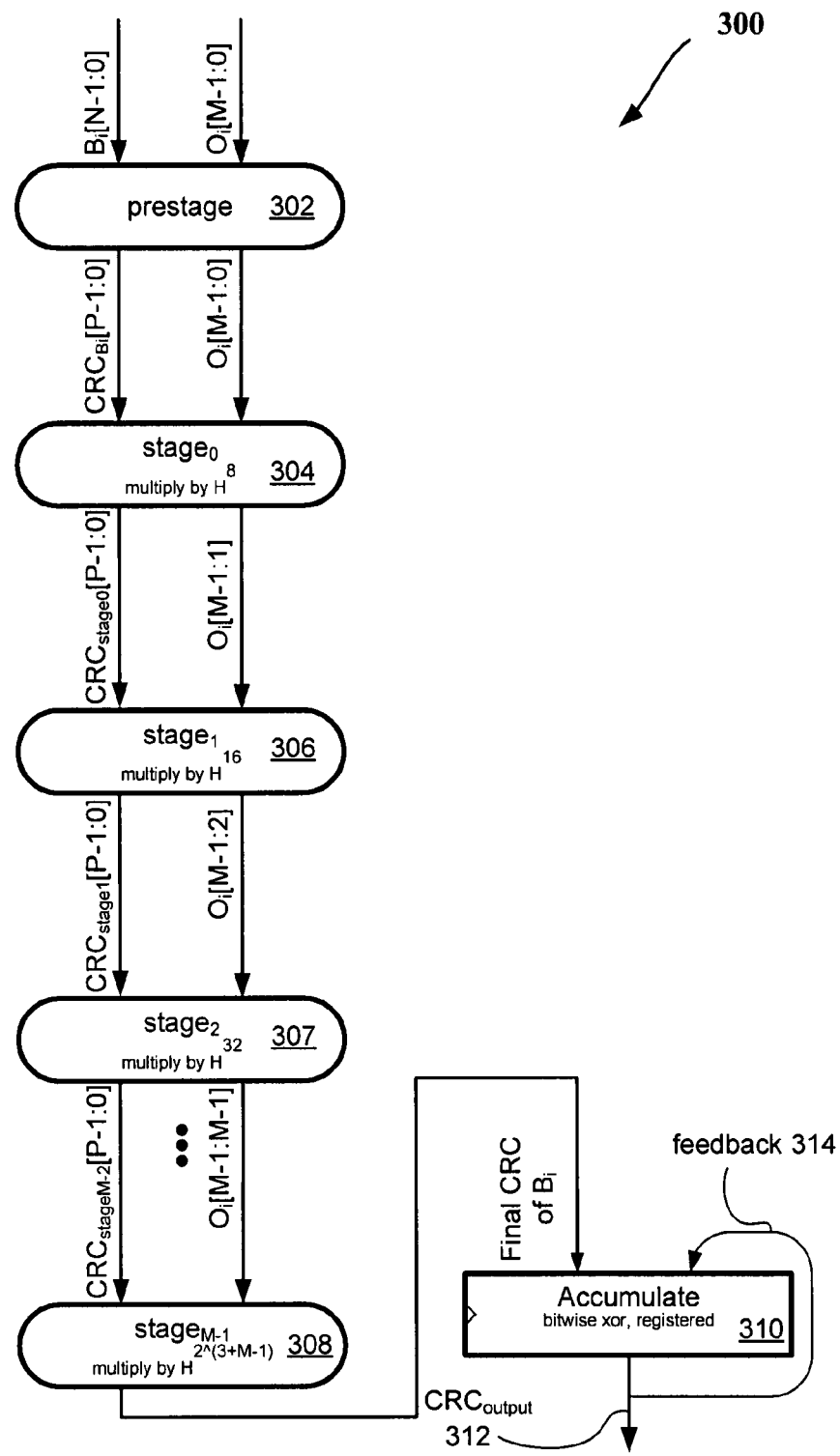
FIG. 3 illustrates a block diagram of various stages of a CRC pipeline, according to an embodiment.

Referring to FIG. 3, a first stage in a CRC pipeline 300 may be referred to as the prestage 302. The prestage 302 may process the Bi, e.g., calculating their CRC values. The blocking process may be illustrated by an example. Assume $B_i$ is of length 8 and is equal to "$B_i(7)B_i(6)B_i(5)B_i(4)B_i(3)B_i(2)B_i(1)B_i(0)$." This may be broken into "Bi(7)0000000", "0Bi(6)000000", ..., "0000000Bi(0)". The CRC for each of these may be pre-computed (or computed by the prestage 302). Then, the CRC of $B_i$ may be equal to the XOR of each of the pre-computed values where there is a 1 in that bit position. Of course, the prestage 302 may be extended to more or less than 8 bits. The prestage 302 may also be pipelined in order to meet a given frequency. As discussed herein, "N" may be the number of input bits for the CRC calculation, "M" may be the number of bits in $O_i$, and "P" may be the number of bits in the computed CRC value.

After prestage 302, one or more intermediate stages (e.g., 304-308) may be used to calculate CRC values (e.g., as shown in FIG. 3) before the results are accumulated at an operation 310 (which may be implemented as a register) to provide the CRC output 312 of the CRC pipeline 300. In an embodiment, stages 304-308 may be used to append zeroes to $B_i$ to put it in the right place in the packet. For example, the position may be calculated in bits from the end of packet, where CRC computation finishes. This value may be called $O_i$.

As illustrated in FIG. 3, each successive stage may use a different power of a matrix H (which is further discussed herein below), e.g., checking if the corresponding bit of $O_i$ is set, and multiplying by that power if it is. As each bit of $O_i$ is used, it may be removed from the pipeline, reducing the amount of state that needs to be kept. Also, in some embodiments, most packets may use bytes as the smallest unit, hence the three least significant bits of $O_i$ may be tied to zero if this is the case, thereby eliminating three stages in the pipeline. This also means that $H^1$, $H^2$, and $H^4$ may not be used. If $O_i$ has M bits then there may be a total of M+2 logical computation stages, including the pre-stage, and a final accumulate stage 310 (which may perform a bitwise XOR operation). As shown in FIG. 3, the entire structure may be feed forward, with the exception of the accumulate stage 310 which may utilize a feedback loop 314.

In some embodiments, registers may be placed anywhere between the stages 302-312 in order to target a specific operating frequency. Furthermore, logical multiplication of the LFSR state by a matrix may be equivalent to an XOR tree, where each output bit may be the XOR of on average half of the input bits. In accordance with at least one embodiment, the CRC may be performed in accordance with International Telecommunication Union (ITU) or Comite Consultatif International de Telegraphique et Telephonique (CCITT) CRC32 which may be compliant with Institute of Electrical & Electronics Engineers (IEEE) 802.3 specification, 1983.

Sample pre-computed matrices (H) for CRC32 are illustrated below. Moreover, matrices H may be used to multiply the state of the CRC32 LFSR, ai. The vector ai may be written as [CRC[0];CRC[1]; ::::;CRC[30];CRC[31]]T (see, e.g., FIG. 1 for how this relates to the CRC32 LFSR). Additionally, as shown in FIG. 3, the final CRC value may be modified at the end of packet in order to reverse the LFSR state due to the excess zeroes, for example. In an embodiment, a different matrix, G, that reverses the effect of H may be used as follows for the CRC32 implementation.

$$H_{CRC32} = \begin{pmatrix}
0 & 0 & 0 & 0 & 0 & 0 & 0 & 0 & 0 & 0 & 0 & 0 & 0 & 0 & 0 & 0 & 0 & 0 & 0 & 0 & 0 & 0 & 0 & 0 & 0 & 0 & 0 & 0 & 0 & 0 & 0 & 1 \\
1 & 0 & 0 & 0 & 0 & 0 & 0 & 0 & 0 & 0 & 0 & 0 & 0 & 0 & 0 & 0 & 0 & 0 & 0 & 0 & 0 & 0 & 0 & 0 & 0 & 0 & 0 & 0 & 0 & 0 & 0 & 1 \\
0 & 1 & 0 & 0 & 0 & 0 & 0 & 0 & 0 & 0 & 0 & 0 & 0 & 0 & 0 & 0 & 0 & 0 & 0 & 0 & 0 & 0 & 0 & 0 & 0 & 0 & 0 & 0 & 0 & 0 & 0 & 1 \\
0 & 0 & 1 & 0 & 0 & 0 & 0 & 0 & 0 & 0 & 0 & 0 & 0 & 0 & 0 & 0 & 0 & 0 & 0 & 0 & 0 & 0 & 0 & 0 & 0 & 0 & 0 & 0 & 0 & 0 & 0 & 0 \\
0 & 0 & 0 & 1 & 0 & 0 & 0 & 0 & 0 & 0 & 0 & 0 & 0 & 0 & 0 & 0 & 0 & 0 & 0 & 0 & 0 & 0 & 0 & 0 & 0 & 0 & 0 & 0 & 0 & 0 & 0 & 1 \\
0 & 0 & 0 & 0 & 1 & 0 & 0 & 0 & 0 & 0 & 0 & 0 & 0 & 0 & 0 & 0 & 0 & 0 & 0 & 0 & 0 & 0 & 0 & 0 & 0 & 0 & 0 & 0 & 0 & 0 & 0 & 1 \\
0 & 0 & 0 & 0 & 0 & 1 & 0 & 0 & 0 & 0 & 0 & 0 & 0 & 0 & 0 & 0 & 0 & 0 & 0 & 0 & 0 & 0 & 0 & 0 & 0 & 0 & 0 & 0 & 0 & 0 & 0 & 0 \\
0 & 0 & 0 & 0 & 0 & 0 & 1 & 0 & 0 & 0 & 0 & 0 & 0 & 0 & 0 & 0 & 0 & 0 & 0 & 0 & 0 & 0 & 0 & 0 & 0 & 0 & 0 & 0 & 0 & 0 & 0 & 1 \\
0 & 0 & 0 & 0 & 0 & 0 & 0 & 1 & 0 & 0 & 0 & 0 & 0 & 0 & 0 & 0 & 0 & 0 & 0 & 0 & 0 & 0 & 0 & 0 & 0 & 0 & 0 & 0 & 0 & 0 & 0 & 1 \\
0 & 0 & 0 & 0 & 0 & 0 & 0 & 0 & 1 & 0 & 0 & 0 & 0 & 0 & 0 & 0 & 0 & 0 & 0 & 0 & 0 & 0 & 0 & 0 & 0 & 0 & 0 & 0 & 0 & 0 & 0 & 0 \\
0 & 0 & 0 & 0 & 0 & 0 & 0 & 0 & 0 & 1 & 0 & 0 & 0 & 0 & 0 & 0 & 0 & 0 & 0 & 0 & 0 & 0 & 0 & 0 & 0 & 0 & 0 & 0 & 0 & 0 & 0 & 1 \\
0 & 0 & 0 & 0 & 0 & 0 & 0 & 0 & 0 & 0 & 1 & 0 & 0 & 0 & 0 & 0 & 0 & 0 & 0 & 0 & 0 & 0 & 0 & 0 & 0 & 0 & 0 & 0 & 0 & 0 & 0 & 1 \\
0 & 0 & 0 & 0 & 0 & 0 & 0 & 0 & 0 & 0 & 0 & 1 & 0 & 0 & 0 & 0 & 0 & 0 & 0 & 0 & 0 & 0 & 0 & 0 & 0 & 0 & 0 & 0 & 0 & 0 & 0 & 1 \\
0 & 0 & 0 & 0 & 0 & 0 & 0 & 0 & 0 & 0 & 0 & 0 & 1 & 0 & 0 & 0 & 0 & 0 & 0 & 0 & 0 & 0 & 0 & 0 & 0 & 0 & 0 & 0 & 0 & 0 & 0 & 0 \\
0 & 0 & 0 & 0 & 0 & 0 & 0 & 0 & 0 & 0 & 0 & 0 & 0 & 1 & 0 & 0 & 0 & 0 & 0 & 0 & 0 & 0 & 0 & 0 & 0 & 0 & 0 & 0 & 0 & 0 & 0 & 0 \\
0 & 0 & 0 & 0 & 0 & 0 & 0 & 0 & 0 & 0 & 0 & 0 & 0 & 0 & 1 & 0 & 0 & 0 & 0 & 0 & 0 & 0 & 0 & 0 & 0 & 0 & 0 & 0 & 0 & 0 & 0 & 0 \\
0 & 0 & 0 & 0 & 0 & 0 & 0 & 0 & 0 & 0 & 0 & 0 & 0 & 0 & 0 & 1 & 0 & 0 & 0 & 0 & 0 & 0 & 0 & 0 & 0 & 0 & 0 & 0 & 0 & 0 & 0 & 1 \\
0 & 0 & 0 & 0 & 0 & 0 & 0 & 0 & 0 & 0 & 0 & 0 & 0 & 0 & 0 & 0 & 1 & 0 & 0 & 0 & 0 & 0 & 0 & 0 & 0 & 0 & 0 & 0 & 0 & 0 & 0 & 0 \\
0 & 0 & 0 & 0 & 0 & 0 & 0 & 0 & 0 & 0 & 0 & 0 & 0 & 0 & 0 & 0 & 0 & 1 & 0 & 0 & 0 & 0 & 0 & 0 & 0 & 0 & 0 & 0 & 0 & 0 & 0 & 0 \\
0 & 0 & 0 & 0 & 0 & 0 & 0 & 0 & 0 & 0 & 0 & 0 & 0 & 0 & 0 & 0 & 0 & 0 & 1 & 0 & 0 & 0 & 0 & 0 & 0 & 0 & 0 & 0 & 0 & 0 & 0 & 0 \\
0 & 0 & 0 & 0 & 0 & 0 & 0 & 0 & 0 & 0 & 0 & 0 & 0 & 0 & 0 & 0 & 0 & 0 & 0 & 1 & 0 & 0 & 0 & 0 & 0 & 0 & 0 & 0 & 0 & 0 & 0 & 0 \\
0 & 0 & 0 & 0 & 0 & 0 & 0 & 0 & 0 & 0 & 0 & 0 & 0 & 0 & 0 & 0 & 0 & 0 & 0 & 0 & 1 & 0 & 0 & 0 & 0 & 0 & 0 & 0 & 0 & 0 & 0 & 0 \\
0 & 0 & 0 & 0 & 0 & 0 & 0 & 0 & 0 & 0 & 0 & 0 & 0 & 0 & 0 & 0 & 0 & 0 & 0 & 0 & 0 & 1 & 0 & 0 & 0 & 0 & 0 & 0 & 0 & 0 & 0 & 1 \\
0 & 0 & 0 & 0 & 0 & 0 & 0 & 0 & 0 & 0 & 0 & 0 & 0 & 0 & 0 & 0 & 0 & 0 & 0 & 0 & 0 & 0 & 1 & 0 & 0 & 0 & 0 & 0 & 0 & 0 & 0 & 1 \\
0 & 0 & 0 & 0 & 0 & 0 & 0 & 0 & 0 & 0 & 0 & 0 & 0 & 0 & 0 & 0 & 0 & 0 & 0 & 0 & 0 & 0 & 0 & 1 & 0 & 0 & 0 & 0 & 0 & 0 & 0 & 0 \\
0 & 0 & 0 & 0 & 0 & 0 & 0 & 0 & 0 & 0 & 0 & 0 & 0 & 0 & 0 & 0 & 0 & 0 & 0 & 0 & 0 & 0 & 0 & 0 & 1 & 0 & 0 & 0 & 0 & 0 & 0 & 0 \\
0 & 0 & 0 & 0 & 0 & 0 & 0 & 0 & 0 & 0 & 0 & 0 & 0 & 0 & 0 & 0 & 0 & 0 & 0 & 0 & 0 & 0 & 0 & 0 & 0 & 1 & 0 & 0 & 0 & 0 & 0 & 1 \\
0 & 0 & 0 & 0 & 0 & 0 & 0 & 0 & 0 & 0 & 0 & 0 & 0 & 0 & 0 & 0 & 0 & 0 & 0 & 0 & 0 & 0 & 0 & 0 & 0 & 0 & 1 & 0 & 0 & 0 & 0 & 0 \\
0 & 0 & 0 & 0 & 0 & 0 & 0 & 0 & 0 & 0 & 0 & 0 & 0 & 0 & 0 & 0 & 0 & 0 & 0 & 0 & 0 & 0 & 0 & 0 & 0 & 0 & 0 & 1 & 0 & 0 & 0 & 0 \\
0 & 0 & 0 & 0 & 0 & 0 & 0 & 0 & 0 & 0 & 0 & 0 & 0 & 0 & 0 & 0 & 0 & 0 & 0 & 0 & 0 & 0 & 0 & 0 & 0 & 0 & 0 & 0 & 1 & 0 & 0 & 0 \\
0 & 0 & 0 & 0 & 0 & 0 & 0 & 0 & 0 & 0 & 0 & 0 & 0 & 0 & 0 & 0 & 0 & 0 & 0 & 0 & 0 & 0 & 0 & 0 & 0 & 0 & 0 & 0 & 0 & 1 & 0 & 0 \\
0 & 0 & 0 & 0 & 0 & 0 & 0 & 0 & 0 & 0 & 0 & 0 & 0 & 0 & 0 & 0 & 0 & 0 & 0 & 0 & 0 & 0 & 0 & 0 & 0 & 0 & 0 & 0 & 0 & 0 & 1 & 0
\end{pmatrix}$$

-continued $$H^2_{CRC32} = \begin{pmatrix}
0 & 0 & 0 & 0 & 0 & 0 & 0 & 0 & 0 & 0 & 0 & 0 & 0 & 0 & 0 & 0 & 0 & 0 & 0 & 0 & 0 & 0 & 0 & 0 & 0 & 0 & 0 & 0 & 0 & 1 & 0 \\
0 & 0 & 0 & 0 & 0 & 0 & 0 & 0 & 0 & 0 & 0 & 0 & 0 & 0 & 0 & 0 & 0 & 0 & 0 & 0 & 0 & 0 & 0 & 0 & 0 & 0 & 0 & 0 & 0 & 1 & 1 \\
1 & 0 & 0 & 0 & 0 & 0 & 0 & 0 & 0 & 0 & 0 & 0 & 0 & 0 & 0 & 0 & 0 & 0 & 0 & 0 & 0 & 0 & 0 & 0 & 0 & 0 & 0 & 0 & 0 & 1 & 1 \\
0 & 1 & 0 & 0 & 0 & 0 & 0 & 0 & 0 & 0 & 0 & 0 & 0 & 0 & 0 & 0 & 0 & 0 & 0 & 0 & 0 & 0 & 0 & 0 & 0 & 0 & 0 & 0 & 0 & 0 & 1 \\
0 & 0 & 1 & 0 & 0 & 0 & 0 & 0 & 0 & 0 & 0 & 0 & 0 & 0 & 0 & 0 & 0 & 0 & 0 & 0 & 0 & 0 & 0 & 0 & 0 & 0 & 0 & 0 & 0 & 1 & 0 \\
0 & 0 & 0 & 1 & 0 & 0 & 0 & 0 & 0 & 0 & 0 & 0 & 0 & 0 & 0 & 0 & 0 & 0 & 0 & 0 & 0 & 0 & 0 & 0 & 0 & 0 & 0 & 0 & 0 & 1 & 1 \\
0 & 0 & 0 & 0 & 1 & 0 & 0 & 0 & 0 & 0 & 0 & 0 & 0 & 0 & 0 & 0 & 0 & 0 & 0 & 0 & 0 & 0 & 0 & 0 & 0 & 0 & 0 & 0 & 0 & 0 & 1 \\
0 & 0 & 0 & 0 & 0 & 1 & 0 & 0 & 0 & 0 & 0 & 0 & 0 & 0 & 0 & 0 & 0 & 0 & 0 & 0 & 0 & 0 & 0 & 0 & 0 & 0 & 0 & 0 & 0 & 1 & 0 \\
0 & 0 & 0 & 0 & 0 & 0 & 1 & 0 & 0 & 0 & 0 & 0 & 0 & 0 & 0 & 0 & 0 & 0 & 0 & 0 & 0 & 0 & 0 & 0 & 0 & 0 & 0 & 0 & 0 & 1 & 1 \\
0 & 0 & 0 & 0 & 0 & 0 & 0 & 1 & 0 & 0 & 0 & 0 & 0 & 0 & 0 & 0 & 0 & 0 & 0 & 0 & 0 & 0 & 0 & 0 & 0 & 0 & 0 & 0 & 0 & 0 & 1 \\
0 & 0 & 0 & 0 & 0 & 0 & 0 & 0 & 1 & 0 & 0 & 0 & 0 & 0 & 0 & 0 & 0 & 0 & 0 & 0 & 0 & 0 & 0 & 0 & 0 & 0 & 0 & 0 & 0 & 1 & 0 \\
0 & 0 & 0 & 0 & 0 & 0 & 0 & 0 & 0 & 1 & 0 & 0 & 0 & 0 & 0 & 0 & 0 & 0 & 0 & 0 & 0 & 0 & 0 & 0 & 0 & 0 & 0 & 0 & 0 & 1 & 1 \\
0 & 0 & 0 & 0 & 0 & 0 & 0 & 0 & 0 & 0 & 1 & 0 & 0 & 0 & 0 & 0 & 0 & 0 & 0 & 0 & 0 & 0 & 0 & 0 & 0 & 0 & 0 & 0 & 0 & 1 & 1 \\
0 & 0 & 0 & 0 & 0 & 0 & 0 & 0 & 0 & 0 & 0 & 1 & 0 & 0 & 0 & 0 & 0 & 0 & 0 & 0 & 0 & 0 & 0 & 0 & 0 & 0 & 0 & 0 & 0 & 0 & 1 \\
0 & 0 & 0 & 0 & 0 & 0 & 0 & 0 & 0 & 0 & 0 & 0 & 1 & 0 & 0 & 0 & 0 & 0 & 0 & 0 & 0 & 0 & 0 & 0 & 0 & 0 & 0 & 0 & 0 & 0 & 0 \\
0 & 0 & 0 & 0 & 0 & 0 & 0 & 0 & 0 & 0 & 0 & 0 & 0 & 1 & 0 & 0 & 0 & 0 & 0 & 0 & 0 & 0 & 0 & 0 & 0 & 0 & 0 & 0 & 0 & 0 & 0 \\
0 & 0 & 0 & 0 & 0 & 0 & 0 & 0 & 0 & 0 & 0 & 0 & 0 & 0 & 1 & 0 & 0 & 0 & 0 & 0 & 0 & 0 & 0 & 0 & 0 & 0 & 0 & 0 & 0 & 1 & 0 \\
0 & 0 & 0 & 0 & 0 & 0 & 0 & 0 & 0 & 0 & 0 & 0 & 0 & 0 & 0 & 1 & 0 & 0 & 0 & 0 & 0 & 0 & 0 & 0 & 0 & 0 & 0 & 0 & 0 & 0 & 1 \\
0 & 0 & 0 & 0 & 0 & 0 & 0 & 0 & 0 & 0 & 0 & 0 & 0 & 0 & 0 & 0 & 1 & 0 & 0 & 0 & 0 & 0 & 0 & 0 & 0 & 0 & 0 & 0 & 0 & 0 & 0 \\
0 & 0 & 0 & 0 & 0 & 0 & 0 & 0 & 0 & 0 & 0 & 0 & 0 & 0 & 0 & 0 & 0 & 1 & 0 & 0 & 0 & 0 & 0 & 0 & 0 & 0 & 0 & 0 & 0 & 0 & 0 \\
0 & 0 & 0 & 0 & 0 & 0 & 0 & 0 & 0 & 0 & 0 & 0 & 0 & 0 & 0 & 0 & 0 & 0 & 1 & 0 & 0 & 0 & 0 & 0 & 0 & 0 & 0 & 0 & 0 & 0 & 0 \\
0 & 0 & 0 & 0 & 0 & 0 & 0 & 0 & 0 & 0 & 0 & 0 & 0 & 0 & 0 & 0 & 0 & 0 & 0 & 1 & 0 & 0 & 0 & 0 & 0 & 0 & 0 & 0 & 0 & 0 & 0 \\
0 & 0 & 0 & 0 & 0 & 0 & 0 & 0 & 0 & 0 & 0 & 0 & 0 & 0 & 0 & 0 & 0 & 0 & 0 & 0 & 1 & 0 & 0 & 0 & 0 & 0 & 0 & 0 & 0 & 1 & 0 \\
0 & 0 & 0 & 0 & 0 & 0 & 0 & 0 & 0 & 0 & 0 & 0 & 0 & 0 & 0 & 0 & 0 & 0 & 0 & 0 & 0 & 1 & 0 & 0 & 0 & 0 & 0 & 0 & 0 & 1 & 1 \\
0 & 0 & 0 & 0 & 0 & 0 & 0 & 0 & 0 & 0 & 0 & 0 & 0 & 0 & 0 & 0 & 0 & 0 & 0 & 0 & 0 & 0 & 1 & 0 & 0 & 0 & 0 & 0 & 0 & 0 & 1 \\
0 & 0 & 0 & 0 & 0 & 0 & 0 & 0 & 0 & 0 & 0 & 0 & 0 & 0 & 0 & 0 & 0 & 0 & 0 & 0 & 0 & 0 & 0 & 1 & 0 & 0 & 0 & 0 & 0 & 0 & 0 \\
0 & 0 & 0 & 0 & 0 & 0 & 0 & 0 & 0 & 0 & 0 & 0 & 0 & 0 & 0 & 0 & 0 & 0 & 0 & 0 & 0 & 0 & 0 & 0 & 1 & 0 & 0 & 0 & 0 & 1 & 0 \\
0 & 0 & 0 & 0 & 0 & 0 & 0 & 0 & 0 & 0 & 0 & 0 & 0 & 0 & 0 & 0 & 0 & 0 & 0 & 0 & 0 & 0 & 0 & 0 & 0 & 1 & 0 & 0 & 0 & 0 & 1 \\
0 & 0 & 0 & 0 & 0 & 0 & 0 & 0 & 0 & 0 & 0 & 0 & 0 & 0 & 0 & 0 & 0 & 0 & 0 & 0 & 0 & 0 & 0 & 0 & 0 & 0 & 1 & 0 & 0 & 0 & 0 \\
0 & 0 & 0 & 0 & 0 & 0 & 0 & 0 & 0 & 0 & 0 & 0 & 0 & 0 & 0 & 0 & 0 & 0 & 0 & 0 & 0 & 0 & 0 & 0 & 0 & 0 & 0 & 1 & 0 & 0 & 0 \\
0 & 0 & 0 & 0 & 0 & 0 & 0 & 0 & 0 & 0 & 0 & 0 & 0 & 0 & 0 & 0 & 0 & 0 & 0 & 0 & 0 & 0 & 0 & 0 & 0 & 0 & 0 & 0 & 1 & 0 & 0 \\
0 & 0 & 0 & 0 & 0 & 0 & 0 & 0 & 0 & 0 & 0 & 0 & 0 & 0 & 0 & 0 & 0 & 0 & 0 & 0 & 0 & 0 & 0 & 0 & 0 & 0 & 0 & 0 & 0 & 1 & 0 & 0
\end{pmatrix}$$

$$H_{CRC32}^{16384} = \begin{pmatrix}
0 & 0 & 0 & 0 & 0 & 0 & 1 & 1 & 1 & 0 & 1 & 0 & 0 & 0 & 0 & 1 & 0 & 1 & 0 & 0 & 1 & 1 & 1 & 1 & 0 & 0 & 0 & 1 & 1 & 0 & 1 & 1 \\
1 & 0 & 0 & 0 & 0 & 0 & 1 & 0 & 0 & 1 & 1 & 1 & 0 & 0 & 0 & 1 & 1 & 1 & 1 & 0 & 1 & 0 & 0 & 0 & 1 & 0 & 0 & 1 & 0 & 1 & 1 & 0 \\
0 & 1 & 0 & 0 & 0 & 0 & 1 & 0 & 1 & 0 & 0 & 1 & 1 & 0 & 0 & 1 & 1 & 0 & 1 & 1 & 1 & 0 & 1 & 1 & 0 & 1 & 0 & 1 & 0 & 0 & 0 & 0 \\
0 & 0 & 1 & 0 & 0 & 0 & 0 & 1 & 0 & 1 & 0 & 0 & 1 & 1 & 0 & 0 & 1 & 1 & 0 & 1 & 1 & 1 & 0 & 1 & 1 & 0 & 1 & 0 & 1 & 0 & 0 & 0 \\
1 & 0 & 0 & 1 & 0 & 0 & 1 & 1 & 0 & 0 & 0 & 0 & 1 & 1 & 1 & 0 & 0 & 1 & 0 & 0 & 0 & 0 & 1 & 1 & 1 & 0 & 0 & 1 & 1 & 1 & 1 & 1 \\
1 & 1 & 0 & 0 & 1 & 0 & 1 & 0 & 0 & 0 & 1 & 0 & 0 & 0 & 1 & 0 & 1 & 1 & 0 & 1 & 1 & 1 & 1 & 1 & 1 & 1 & 1 & 1 & 1 & 1 & 0 & 0 \\
0 & 1 & 1 & 0 & 0 & 1 & 0 & 1 & 0 & 0 & 0 & 1 & 0 & 0 & 0 & 1 & 0 & 1 & 1 & 0 & 1 & 1 & 1 & 1 & 1 & 1 & 1 & 1 & 1 & 1 & 1 & 0 \\
1 & 0 & 1 & 1 & 0 & 0 & 0 & 1 & 0 & 0 & 1 & 0 & 1 & 0 & 0 & 1 & 1 & 1 & 1 & 1 & 1 & 0 & 0 & 0 & 1 & 1 & 1 & 0 & 0 & 1 & 0 & 0 \\
0 & 1 & 0 & 1 & 1 & 0 & 1 & 1 & 0 & 0 & 1 & 1 & 0 & 1 & 0 & 1 & 1 & 0 & 1 & 1 & 0 & 0 & 1 & 1 & 0 & 1 & 1 & 0 & 1 & 0 & 0 & 1 \\
1 & 0 & 1 & 0 & 1 & 1 & 0 & 1 & 1 & 0 & 0 & 1 & 1 & 0 & 1 & 0 & 1 & 1 & 0 & 1 & 1 & 0 & 0 & 1 & 1 & 0 & 1 & 1 & 0 & 1 & 0 & 0 \\
0 & 1 & 0 & 1 & 0 & 1 & 0 & 1 & 0 & 1 & 1 & 0 & 1 & 1 & 0 & 0 & 0 & 0 & 1 & 0 & 0 & 0 & 1 & 1 & 1 & 1 & 0 & 0 & 0 & 0 & 0 & 1 \\
0 & 0 & 1 & 0 & 1 & 0 & 0 & 1 & 0 & 0 & 0 & 1 & 0 & 1 & 1 & 1 & 0 & 1 & 0 & 1 & 1 & 1 & 1 & 0 & 1 & 1 & 1 & 1 & 1 & 0 & 1 & 1 \\
0 & 0 & 0 & 1 & 0 & 1 & 1 & 1 & 0 & 0 & 1 & 0 & 1 & 0 & 1 & 0 & 1 & 1 & 1 & 0 & 0 & 0 & 0 & 0 & 1 & 1 & 0 & 0 & 1 & 1 & 0 & 0 \\
1 & 0 & 0 & 0 & 1 & 0 & 1 & 1 & 1 & 0 & 0 & 1 & 0 & 1 & 0 & 1 & 0 & 1 & 1 & 1 & 0 & 0 & 0 & 0 & 0 & 1 & 1 & 0 & 0 & 1 & 1 & 0 \\
1 & 1 & 0 & 0 & 0 & 1 & 0 & 1 & 1 & 1 & 0 & 0 & 1 & 0 & 1 & 0 & 1 & 0 & 1 & 1 & 1 & 0 & 0 & 0 & 0 & 0 & 1 & 1 & 0 & 0 & 1 & 1 \\
1 & 1 & 1 & 0 & 0 & 0 & 1 & 0 & 1 & 1 & 1 & 0 & 0 & 1 & 0 & 1 & 0 & 1 & 0 & 1 & 1 & 1 & 0 & 0 & 0 & 0 & 0 & 1 & 1 & 0 & 0 & 1 \\
1 & 1 & 1 & 1 & 0 & 0 & 0 & 1 & 0 & 1 & 1 & 1 & 0 & 0 & 1 & 0 & 1 & 0 & 1 & 0 & 1 & 1 & 1 & 0 & 0 & 0 & 0 & 0 & 1 & 1 & 0 & 0 \\
1 & 1 & 1 & 1 & 1 & 0 & 0 & 1 & 1 & 0 & 1 & 0 & 0 & 1 & 1 & 1 & 1 & 0 & 0 & 0 & 0 & 1 & 0 & 0 & 0 & 1 & 1 & 1 & 0 & 1 & 0 & 1 \\
0 & 1 & 1 & 1 & 1 & 0 & 1 & 0 & 1 & 1 & 0 & 1 & 0 & 0 & 1 & 1 & 1 & 1 & 0 & 0 & 0 & 0 & 1 & 0 & 0 & 0 & 1 & 1 & 1 & 1 & 1 & 0 \\
1 & 0 & 1 & 1 & 1 & 1 & 0 & 0 & 1 & 0 & 1 & 1 & 0 & 1 & 0 & 0 & 1 & 1 & 1 & 1 & 0 & 0 & 0 & 0 & 1 & 0 & 0 & 0 & 1 & 1 & 1 & 1 \\
1 & 1 & 0 & 1 & 1 & 1 & 1 & 0 & 0 & 1 & 0 & 1 & 1 & 0 & 1 & 0 & 0 & 1 & 1 & 1 & 1 & 0 & 0 & 0 & 0 & 1 & 0 & 0 & 0 & 1 & 1 & 1 \\
1 & 1 & 1 & 0 & 1 & 1 & 1 & 1 & 0 & 0 & 1 & 0 & 1 & 1 & 0 & 1 & 0 & 0 & 1 & 1 & 1 & 1 & 0 & 0 & 0 & 0 & 1 & 0 & 0 & 0 & 1 & 1 \\
0 & 1 & 1 & 1 & 0 & 1 & 1 & 1 & 1 & 0 & 0 & 1 & 0 & 1 & 1 & 0 & 1 & 0 & 0 & 1 & 1 & 1 & 1 & 0 & 0 & 0 & 0 & 1 & 0 & 0 & 0 & 0 \\
1 & 0 & 1 & 1 & 1 & 0 & 0 & 0 & 1 & 1 & 0 & 1 & 0 & 1 & 0 & 0 & 0 & 0 & 0 & 0 & 0 & 0 & 1 & 0 & 0 & 1 & 1 & 1 & 1 & 1 & 1 & 1 \\
0 & 1 & 0 & 1 & 1 & 1 & 1 & 1 & 1 & 0 & 0 & 1 & 0 & 1 & 0 & 0 & 0 & 1 & 0 & 0 & 1 & 1 & 1 & 1 & 0 & 1 & 0 & 1 & 0 & 1 & 0 & 0 \\
1 & 0 & 1 & 0 & 1 & 1 & 1 & 1 & 1 & 1 & 0 & 0 & 1 & 0 & 1 & 0 & 0 & 0 & 1 & 0 & 0 & 1 & 1 & 1 & 1 & 0 & 1 & 0 & 1 & 0 & 1 & 0 \\
1 & 1 & 0 & 1 & 0 & 1 & 1 & 1 & 1 & 1 & 1 & 0 & 0 & 1 & 0 & 1 & 0 & 0 & 0 & 1 & 0 & 0 & 1 & 1 & 1 & 1 & 0 & 1 & 0 & 1 & 0 & 1 \\
1 & 1 & 1 & 0 & 1 & 0 & 0 & 0 & 0 & 1 & 0 & 1 & 0 & 0 & 1 & 1 & 1 & 1 & 0 & 0 & 0 & 1 & 1 & 0 & 1 & 1 & 1 & 1 & 0 & 0 & 0 & 1 \\
0 & 1 & 1 & 1 & 0 & 1 & 0 & 0 & 0 & 0 & 1 & 0 & 1 & 0 & 0 & 1 & 1 & 1 & 1 & 0 & 0 & 0 & 1 & 1 & 0 & 1 & 1 & 1 & 1 & 0 & 0 & 0 \\
0 & 0 & 1 & 1 & 1 & 0 & 1 & 0 & 0 & 0 & 0 & 1 & 0 & 1 & 0 & 0 & 1 & 1 & 1 & 1 & 0 & 0 & 0 & 1 & 1 & 0 & 1 & 1 & 1 & 1 & 0 & 0 \\
0 & 0 & 0 & 1 & 1 & 1 & 0 & 1 & 0 & 0 & 0 & 0 & 1 & 0 & 1 & 0 & 0 & 1 & 1 & 1 & 1 & 0 & 0 & 0 & 1 & 1 & 0 & 1 & 1 & 1 & 1 & 0 \\
0 & 0 & 0 & 0 & 1 & 1 & 1 & 0 & 1 & 0 & 0 & 0 & 0 & 1 & 0 & 1 & 0 & 0 & 1 & 1 & 1 & 1 & 0 & 0 & 0 & 1 & 1 & 0 & 1 & 1 & 1 & 1 \\
0 & 0 & 0 & 0 & 0 & 1 & 1 & 1 & 0 & 1 & 0 & 0 & 0 & 0 & 1 & 0 & 1 & 0 & 0 & 1 & 1 & 1 & 1 & 0 & 0 & 0 & 1 & 1 & 0 & 1 & 1 & 1
\end{pmatrix}$$

$$G_{CRC32} = \begin{pmatrix}
1 & 1 & 0 & 0 & 0 & 0 & 0 & 0 & 0 & 0 & 0 & 0 & 0 & 0 & 0 & 0 & 0 & 0 & 0 & 0 & 0 & 0 & 0 & 0 & 0 & 0 & 0 & 0 & 0 & 0 & 0 & 0 \\
1 & 0 & 1 & 0 & 0 & 0 & 0 & 0 & 0 & 0 & 0 & 0 & 0 & 0 & 0 & 0 & 0 & 0 & 0 & 0 & 0 & 0 & 0 & 0 & 0 & 0 & 0 & 0 & 0 & 0 & 0 & 0 \\
0 & 0 & 0 & 1 & 0 & 0 & 0 & 0 & 0 & 0 & 0 & 0 & 0 & 0 & 0 & 0 & 0 & 0 & 0 & 0 & 0 & 0 & 0 & 0 & 0 & 0 & 0 & 0 & 0 & 0 & 0 & 0 \\
1 & 0 & 0 & 0 & 1 & 0 & 0 & 0 & 0 & 0 & 0 & 0 & 0 & 0 & 0 & 0 & 0 & 0 & 0 & 0 & 0 & 0 & 0 & 0 & 0 & 0 & 0 & 0 & 0 & 0 & 0 & 0 \\
1 & 0 & 0 & 0 & 0 & 1 & 0 & 0 & 0 & 0 & 0 & 0 & 0 & 0 & 0 & 0 & 0 & 0 & 0 & 0 & 0 & 0 & 0 & 0 & 0 & 0 & 0 & 0 & 0 & 0 & 0 & 0 \\
0 & 0 & 0 & 0 & 0 & 0 & 1 & 0 & 0 & 0 & 0 & 0 & 0 & 0 & 0 & 0 & 0 & 0 & 0 & 0 & 0 & 0 & 0 & 0 & 0 & 0 & 0 & 0 & 0 & 0 & 0 & 0 \\
1 & 0 & 0 & 0 & 0 & 0 & 0 & 1 & 0 & 0 & 0 & 0 & 0 & 0 & 0 & 0 & 0 & 0 & 0 & 0 & 0 & 0 & 0 & 0 & 0 & 0 & 0 & 0 & 0 & 0 & 0 & 0 \\
1 & 0 & 0 & 0 & 0 & 0 & 0 & 0 & 1 & 0 & 0 & 0 & 0 & 0 & 0 & 0 & 0 & 0 & 0 & 0 & 0 & 0 & 0 & 0 & 0 & 0 & 0 & 0 & 0 & 0 & 0 & 0 \\
0 & 0 & 0 & 0 & 0 & 0 & 0 & 0 & 0 & 1 & 0 & 0 & 0 & 0 & 0 & 0 & 0 & 0 & 0 & 0 & 0 & 0 & 0 & 0 & 0 & 0 & 0 & 0 & 0 & 0 & 0 & 0 \\
1 & 0 & 0 & 0 & 0 & 0 & 0 & 0 & 0 & 0 & 1 & 0 & 0 & 0 & 0 & 0 & 0 & 0 & 0 & 0 & 0 & 0 & 0 & 0 & 0 & 0 & 0 & 0 & 0 & 0 & 0 & 0 \\
1 & 0 & 0 & 0 & 0 & 0 & 0 & 0 & 0 & 0 & 0 & 1 & 0 & 0 & 0 & 0 & 0 & 0 & 0 & 0 & 0 & 0 & 0 & 0 & 0 & 0 & 0 & 0 & 0 & 0 & 0 & 0 \\
1 & 0 & 0 & 0 & 0 & 0 & 0 & 0 & 0 & 0 & 0 & 0 & 1 & 0 & 0 & 0 & 0 & 0 & 0 & 0 & 0 & 0 & 0 & 0 & 0 & 0 & 0 & 0 & 0 & 0 & 0 & 0 \\
0 & 0 & 0 & 0 & 0 & 0 & 0 & 0 & 0 & 0 & 0 & 0 & 0 & 1 & 0 & 0 & 0 & 0 & 0 & 0 & 0 & 0 & 0 & 0 & 0 & 0 & 0 & 0 & 0 & 0 & 0 & 0 \\
0 & 0 & 0 & 0 & 0 & 0 & 0 & 0 & 0 & 0 & 0 & 0 & 0 & 0 & 1 & 0 & 0 & 0 & 0 & 0 & 0 & 0 & 0 & 0 & 0 & 0 & 0 & 0 & 0 & 0 & 0 & 0 \\
0 & 0 & 0 & 0 & 0 & 0 & 0 & 0 & 0 & 0 & 0 & 0 & 0 & 0 & 0 & 1 & 0 & 0 & 0 & 0 & 0 & 0 & 0 & 0 & 0 & 0 & 0 & 0 & 0 & 0 & 0 & 0 \\
1 & 0 & 0 & 0 & 0 & 0 & 0 & 0 & 0 & 0 & 0 & 0 & 0 & 0 & 0 & 0 & 1 & 0 & 0 & 0 & 0 & 0 & 0 & 0 & 0 & 0 & 0 & 0 & 0 & 0 & 0 & 0 \\
0 & 0 & 0 & 0 & 0 & 0 & 0 & 0 & 0 & 0 & 0 & 0 & 0 & 0 & 0 & 0 & 0 & 1 & 0 & 0 & 0 & 0 & 0 & 0 & 0 & 0 & 0 & 0 & 0 & 0 & 0 & 0 \\
0 & 0 & 0 & 0 & 0 & 0 & 0 & 0 & 0 & 0 & 0 & 0 & 0 & 0 & 0 & 0 & 0 & 0 & 1 & 0 & 0 & 0 & 0 & 0 & 0 & 0 & 0 & 0 & 0 & 0 & 0 & 0 \\
0 & 0 & 0 & 0 & 0 & 0 & 0 & 0 & 0 & 0 & 0 & 0 & 0 & 0 & 0 & 0 & 0 & 0 & 0 & 1 & 0 & 0 & 0 & 0 & 0 & 0 & 0 & 0 & 0 & 0 & 0 & 0 \\
0 & 0 & 0 & 0 & 0 & 0 & 0 & 0 & 0 & 0 & 0 & 0 & 0 & 0 & 0 & 0 & 0 & 0 & 0 & 0 & 1 & 0 & 0 & 0 & 0 & 0 & 0 & 0 & 0 & 0 & 0 & 0 \\
0 & 0 & 0 & 0 & 0 & 0 & 0 & 0 & 0 & 0 & 0 & 0 & 0 & 0 & 0 & 0 & 0 & 0 & 0 & 0 & 0 & 1 & 0 & 0 & 0 & 0 & 0 & 0 & 0 & 0 & 0 & 0 \\
1 & 0 & 0 & 0 & 0 & 0 & 0 & 0 & 0 & 0 & 0 & 0 & 0 & 0 & 0 & 0 & 0 & 0 & 0 & 0 & 0 & 0 & 1 & 0 & 0 & 0 & 0 & 0 & 0 & 0 & 0 & 0 \\
1 & 0 & 0 & 0 & 0 & 0 & 0 & 0 & 0 & 0 & 0 & 0 & 0 & 0 & 0 & 0 & 0 & 0 & 0 & 0 & 0 & 0 & 0 & 1 & 0 & 0 & 0 & 0 & 0 & 0 & 0 & 0 \\
0 & 0 & 0 & 0 & 0 & 0 & 0 & 0 & 0 & 0 & 0 & 0 & 0 & 0 & 0 & 0 & 0 & 0 & 0 & 0 & 0 & 0 & 0 & 0 & 1 & 0 & 0 & 0 & 0 & 0 & 0 & 0 \\
0 & 0 & 0 & 0 & 0 & 0 & 0 & 0 & 0 & 0 & 0 & 0 & 0 & 0 & 0 & 0 & 0 & 0 & 0 & 0 & 0 & 0 & 0 & 0 & 0 & 1 & 0 & 0 & 0 & 0 & 0 & 0 \\
1 & 0 & 0 & 0 & 0 & 0 & 0 & 0 & 0 & 0 & 0 & 0 & 0 & 0 & 0 & 0 & 0 & 0 & 0 & 0 & 0 & 0 & 0 & 0 & 0 & 0 & 1 & 0 & 0 & 0 & 0 & 0 \\
0 & 0 & 0 & 0 & 0 & 0 & 0 & 0 & 0 & 0 & 0 & 0 & 0 & 0 & 0 & 0 & 0 & 0 & 0 & 0 & 0 & 0 & 0 & 0 & 0 & 0 & 0 & 1 & 0 & 0 & 0 & 0 \\
0 & 0 & 0 & 0 & 0 & 0 & 0 & 0 & 0 & 0 & 0 & 0 & 0 & 0 & 0 & 0 & 0 & 0 & 0 & 0 & 0 & 0 & 0 & 0 & 0 & 0 & 0 & 0 & 1 & 0 & 0 & 0 \\
0 & 0 & 0 & 0 & 0 & 0 & 0 & 0 & 0 & 0 & 0 & 0 & 0 & 0 & 0 & 0 & 0 & 0 & 0 & 0 & 0 & 0 & 0 & 0 & 0 & 0 & 0 & 0 & 0 & 1 & 0 & 0 \\
0 & 0 & 0 & 0 & 0 & 0 & 0 & 0 & 0 & 0 & 0 & 0 & 0 & 0 & 0 & 0 & 0 & 0 & 0 & 0 & 0 & 0 & 0 & 0 & 0 & 0 & 0 & 0 & 0 & 0 & 1 & 0 \\
0 & 0 & 0 & 0 & 0 & 0 & 0 & 0 & 0 & 0 & 0 & 0 & 0 & 0 & 0 & 0 & 0 & 0 & 0 & 0 & 0 & 0 & 0 & 0 & 0 & 0 & 0 & 0 & 0 & 0 & 0 & 1 \\
1 & 0 & 0 & 0 & 0 & 0 & 0 & 0 & 0 & 0 & 0 & 0 & 0 & 0 & 0 & 0 & 0 & 0 & 0 & 0 & 0 & 0 & 0 & 0 & 0 & 0 & 0 & 0 & 0 & 0 & 0 & 0
\end{pmatrix}$$

Calculating the new CRC of a modified packet may be performed frequently in some embodiments. Accordingly, it may be more efficient to just feed in the modified data, $B'_i$, and not feed the whole packet through the CRC pipeline 300. Feeding the same $\{B_i, O_i\}$ pair through twice may remove the effect of that pair towards the CRC calculation. Once $B_i$ has been removed, $B'_i$ may be added by feeding $\{B'_i, O_i\}$ through the pipeline 300. In an embodiment, feeding $\{B'_i \square B_i, O_i\}$ through may accomplish the same with only feeding one value down the pipeline 300.

Furthermore, if packet data arrives out of order, $O_i$ may be calculated such that it corresponds to the position of the new packet data. As long as $O_i$ is accurate, the final CRC should be correct once all packet pieces have been fed through the pipeline 300.

Figure 4:
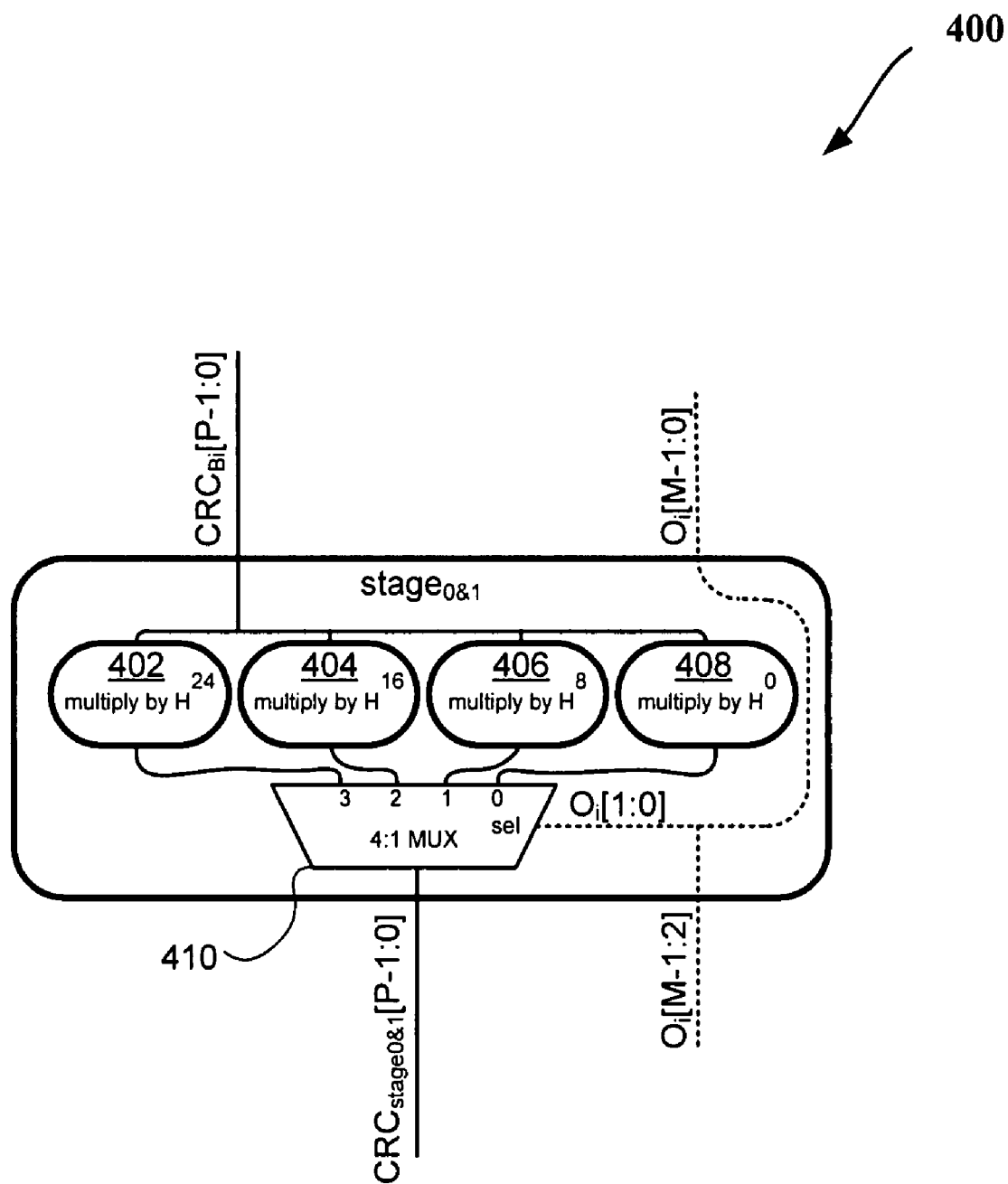
FIG. 4 illustrates a block diagram of a portion of a CRC pipeline, according to an embodiment.

FIG. 4 illustrates a block diagram of a portion of a CRC pipeline 400, according to an embodiment. In one embodiment, the portion 400 illustrates how stages 304 and 306 of FIG. 3 may be combined, e.g., in order to reduce pipeline latency. As shown in FIG. 4, four multiplications may be performed (e.g., at operations 402-408) with the results being fed to a multiplexer 410 may utilizes the input offset value to select the result of the multiplications of operations 402-408. Moreover, referring to FIG. 3, at each stage, one bit of $O_i$ is examined at a time. If two bits of $O_i$ are examined at a time, the basic structure for each stage may be as shown in FIG. 4 in an embodiment.

As mentioned with reference to FIG. 2, when the size of the packet is unknown beforehand, the packet may be blocked as shown with reference to packet 200. This may be handled by assigning to $O_i$ the maximum packet size for the first $B_i$. In general, $O_{i-x}$ may be equal to $O_{i-x}$ size($B_i$). Once the end of the packet has been received, the final CRC value may be adjusted to remove the excess zeroes appended to the end of the packet. For example, the matrix G discussed above may be used to reverse the operation of matrix H. The matrix G may be raised to the power of the number of excess zeroes. In an embodiment, this calculation may be done once per packet, and so may be done in software or hardware, depending on the performance requirements and/or implementation.

Referring to FIGS. 1-4, an example will now be discussed for illustrative purposes. For example, CRC32 may be simplified by removing the requirement in CRC32 of complementing the first 32 bits, as well as complementing the output. Take 8 bytes: 0x11 0x22 0x33 0x44 0x55 0x66 0x77 0x88. Calculate the simplified CRC32 over these 8 bytes. The first portion transmitted is the left byte 0x11. The least significant bit of 0x11 is fed through the LFSR first. Hence:
(a) simplified crc32=0xf43a3eab
Now calculate the simplified CRC32 over these 8 bytes 0x11 0x22 0x33 0x44 0x00 0x00 0x00 0x00:
(b) simplified crc32=0xc7ae928a
Now calculate the simplified CRC32 over these 4 bytes: 0x55 0x66 0x77 0x88:
(c) simplified crc32=0x3394ac21

It may be seen that (a) is "(b) XOR (c)". This illustrates that a packet may be decomposed into multiple independent packets and the CRC calculated over these independent packets concurrently, and at the end the results may be XOR'ed together. So for example, a packet of: 0x11 0x22 0x33 0x44 0x55 0x66 0x77 0x88 0x99 0xaa 0xbb 0xcc 0xdd 0xee 0xff 0xff, could be decomposed into 4 packets of:
(a) 0x11 0x22 0x33 0x44 0x00 0x00 0x00 0x00 0x00 0x00 0x00 0x00 0x00 0x00 0x00 0x00
(b) 0x55 0x66 0x77 0x88 0x00 0x00 0x00 0x00 0x00 0x00 0x00 0x00
(c) 0x99 0xaa 0xbb 0xcc 0x00 0x00 0x00 0x00
(d) 0xdd 0xee 0xff 0xff The sizes of the decomposition in this case are 32 bits, however the portions may be greater than 32 bits. In some embodiments, area increases linearly as the data input size increases, and frequency remains largely unaffected. As discussed with reference to FIGS. 1-4, the CRC32 may be calculated in two stages. The first stage, the "prestage" may take one cycle. For example, at prestage 302, if the data width of the input data is 1024 bits, the state of the CRC32 shift register may be known after shifting all these 1024 bits through. This may be done by first decomposing into packets with only one '1' where there's a corresponding '1' in the 1024 bit word. For example, with an 8 bit word:
Original word: "10100101"
Goes to: "10000000" XOR "00100000" XOR "00000100" XOR "00000001"

The state of the CRC32 shift register for each of these words may be pre-computed. Hence, for each bit of the input data, a 32 bit constant may be pre-computed. The state of the CRC32 shift register is the XOR of each of these constants that corresponds to where a '1' exists in the input data. At the end of the prestage, the state of the CRC32 shift register is known based on the 1024 bits. Now using offset, the state of the CRC32 shift register may be known after offset (11 down to 0) bytes of zeroes are appended to the data. Calculating this requires matrix multiplication with all operations modulo 2 (e.g., by utilizing XOR's). As discussed previously, the matrices may be pre-computed. Each stage in the pipeline 300 may consider a different bit of offset, and if that bit is '1', performs the matrix multiplication. At the end of all the stages, the final value may be XOR'ed with the value from all the previous packet fragments. If larger packets need to be handled (more bits in offset), more stages may be added to the pipeline 300.

In some embodiments, techniques discussed herein may provide one or more of the following: (1) pipelining CRC calculations may allow adding register stages in order to target a specific operational frequency; (2) once the target operating frequency is obtained, the throughput requirement may be reached by scaling the data width; (3) area may be traded for pipeline latency by combining stages, however the maximum operating frequency may be slightly affected by the addition of a multiplexer at the output of each stage; (4) computing the CRC over fragments of data smaller than the input data width may be more efficient, for example if data arrival is bursty, this prevents data from waiting at the CRC input until a full $B_i$ is available; (5) modifying a known good CRC when a small subset of a packet changes does not require feeding the entire packet through; and/or (6) CRC may be calculated on data that arrives out of order.

Figure 5:
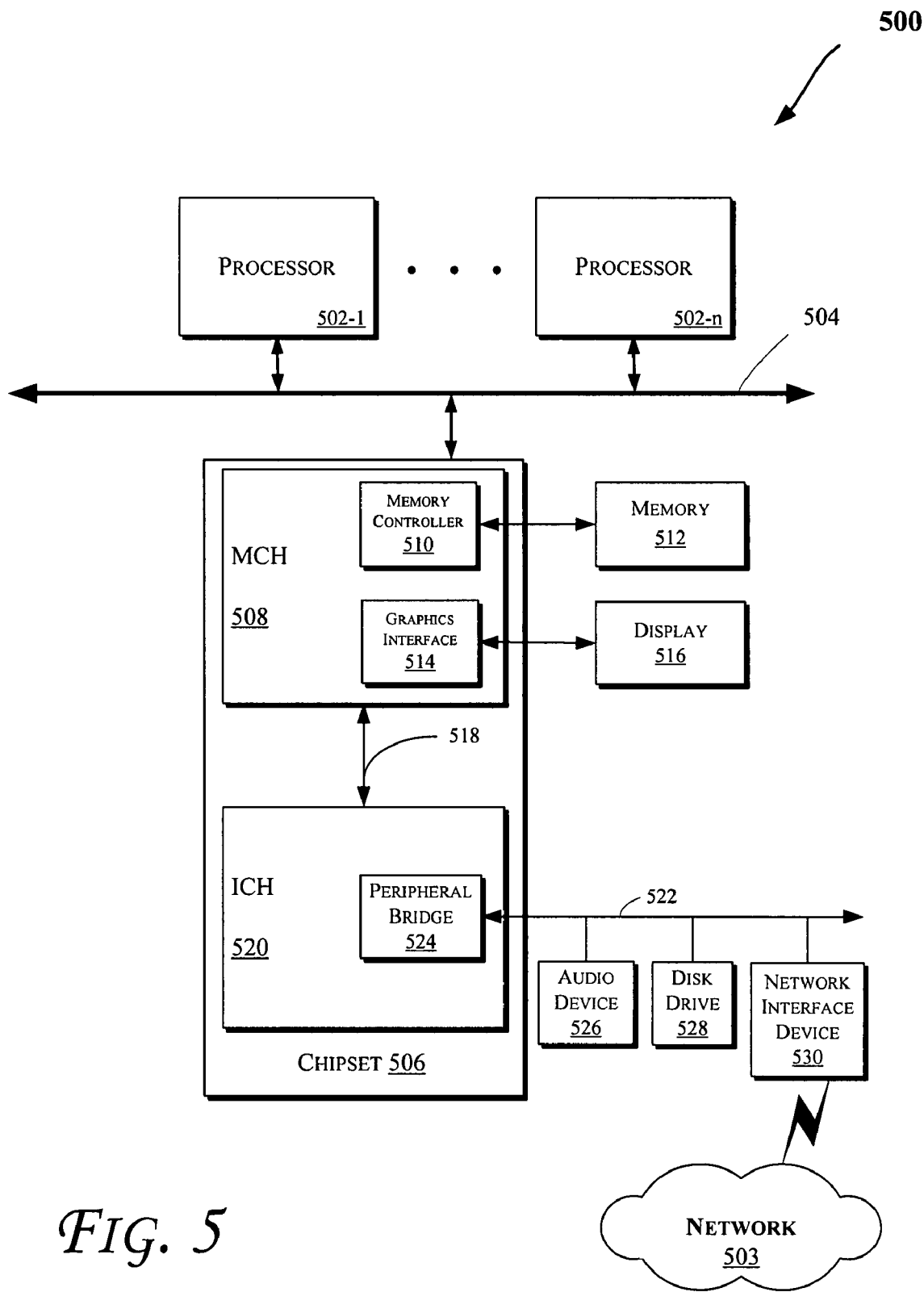
FIG. 5 illustrates a block diagram of a computing system in accordance with an embodiment of the invention.

FIG. 5 illustrates a block diagram of a computing system 500 in accordance with an embodiment of the invention. The computing system 500 may include one or more central processing unit(s) (CPUs) 502 or processors that communicate via an interconnection network (or bus) 504. The processors 502 may include a general purpose processor, a network processor (that processes data communicated over a computer network 503), or other types of a processor (including a reduced instruction set computer (RISC) processor or a complex instruction set computer (CISC)). Moreover, the processors 502 may have a single or multiple core design. The processors 502 with a multiple core design may integrate different types of processor cores on the same integrated circuit (IC) die. Also, the processors 502 with a multiple core design may be implemented as symmetrical or asymmetrical multiprocessors. Moreover, the operations discussed with reference to FIGS. 1-4 may be performed by one or more components of the system 500. Also, one or more of the components of FIG. 5 may communicate with each other, e.g., by utilizing a pipelined CRC calculation such as discussed with reference to FIGS. 1-4.

A chipset 506 may also communicate with the interconnection network 504. The chipset 506 may include a memory control hub (MCH) 508. The MCH 508 may include a memory controller 510 that communicates with a memory 512. The memory 512 may store data, including sequences of instructions that are executed by the CPU 502, or any other device included in the computing system 500. In one embodiment of the invention, the memory 512 may include one or more volatile storage (or memory) devices such as random access memory (RAM), dynamic RAM (DRAM), synchronous DRAM (SDRAM), static RAM (SRAM), or other types of storage devices. Nonvolatile memory may also be utilized such as a hard disk. Additional devices may communicate via the interconnection network 504, such as multiple CPUs and/or multiple system memories.

The MCH 508 may also include a graphics interface 514 that communicates with a display 516. In one embodiment of the invention, the graphics interface 514 may communicate with the display 516 via an accelerated graphics port (AGP). In an embodiment of the invention, the display 516 may be a flat panel display that communicates with the graphics interface 514 through, for example, a signal converter that translates a digital representation of an image stored in a storage device such as video memory or system memory into display signals that are interpreted and displayed by the display 516. The display signals produced by the interface 514 may pass through various control devices before being interpreted by and subsequently displayed on the display 516.

A hub interface 518 may allow the MCH 508 and an input/output control hub (ICH) 520 to communicate. The ICH 520 may provide an interface to I/O devices that communicate with the computing system 500. The ICH 520 may communicate with a bus 522 through a peripheral bridge (or controller) 524, such as a peripheral component interconnect (PCI) bridge, a universal serial bus (USB) controller, or other types of peripheral bridges or controllers. The bridge 524 may provide a data path between the CPU 502 and peripheral devices. Other types of topologies may be utilized. Also, multiple buses may communicate with the ICH 520, e.g., through multiple bridges or controllers. Moreover, other peripherals in communication with the ICH 520 may include, in various embodiments of the invention, integrated drive electronics (IDE) or small computer system interface (SCSI)

hard drive(s), USB port(s), a keyboard, a mouse, parallel port(s), serial port(s), floppy disk drive(s), digital output support (e.g., digital video interface (DVI)), or other devices.

The bus 522 may communicate with an audio device 526, one or more disk drive(s) 528, and a network interface device 530 (which is in communication with the computer network 503). Other devices may communicate via the bus 522. Also, various components (such as the network interface device 530) may communicate with the MCH 508 in some embodiments of the invention. In addition, the processor 502 and the MCH 508 may be combined to form a single chip. Furthermore, the graphics interface 514 may be included within the MCH 508 in other embodiments of the invention.

Furthermore, the computing system 500 may include volatile and/or nonvolatile memory (or storage). For example, nonvolatile memory may include one or more of the following: read-only memory (ROM), programmable ROM (PROM), erasable PROM (EPROM), electrically EPROM (EEPROM), a disk drive (e.g., 528), a floppy disk, a compact disk ROM (CD-ROM), a digital versatile disk (DVD), flash memory, a magneto-optical disk, or other types of nonvolatile machine-readable media that are capable of storing electronic data (e.g., including instructions). In an embodiment, components of the system 500 may be arranged in a point-to-point (PtP) configuration. For example, processors, memory, and/or input/output devices may be interconnected by a number of point-to-point interfaces.

In various embodiments of the invention, the operations discussed herein, e.g., with reference to FIGS. 1-5, may be implemented as hardware (e.g., logic circuitry), software, firmware, or combinations thereof, which may be provided as a computer program product, e.g., including a machine-readable or computer-readable medium having stored thereon instructions (or software procedures) used to program a computer to perform a process discussed herein. The machine-readable medium may include a storage device such as those discussed with respect to FIG. 5.

Additionally, such computer-readable media may be downloaded as a computer program product, wherein the program may be transferred from a remote computer (e.g., a server) to a requesting computer (e.g., a client) by way of data signals embodied in a carrier wave or other propagation medium via a communication link (e.g., a bus, a modem, or a network connection). Accordingly, herein, a carrier wave shall be regarded as comprising a machine-readable medium.

Thus, although embodiments of the invention have been described in language specific to structural features and/or methodological acts, it is to be understood that claimed subject matter may not be limited to the specific features or acts described. Rather, the specific features and acts are disclosed as sample forms of implementing the claimed subject matter.

What is claimed is:

1. An apparatus comprising:
    a plurality of stages to determine a plurality of cyclic redundancy check (CRC) values corresponding to portions of a data packet; and
    logic circuitry to accumulate the plurality CRC values, through bitwise XOR operations, to determine a CRC value for the data packet, wherein the plurality of stages are to comprise one or more intermediate stages to determine a final CRC value of a portion of the data packet, wherein each of the one or more intermediate stages are to multiply CRC values, corresponding to portions of the data packet, with a different matrix to generate one or more intermediate stage CRC values, and wherein one of the one or more intermediate stage CRC values is to be selected as the final CRC value of the portion of the data packet based on an input offset value.

2. The apparatus of claim 1, wherein the plurality of stages comprise a prestage to determine an initial CRC value of a portion of the data packet.

3. The apparatus of claim 1, wherein previous stages of the plurality stages communicate the offset values to subsequent stages of the plurality of stages.

4. The apparatus of claim 1, wherein the logic to accumulate comprises a bitwise XOR register.

5. The apparatus of claim 1, further comprising one or more registers to couple one or more of the plurality of stages.

6. The apparatus of claim 1, wherein the each of the one or more intermediate stages are to multiply the CRC values in parallel.

7. The apparatus of claim 1, further comprising a multiplexer to select one of the one or more intermediate stage CRC values as the final CRC value of the portion of the data packet based on the input offset value.

8. A method comprising:
    determining a plurality of cyclic redundancy check (CRC) values corresponding to portions of a data packet; and
    accumulating the plurality CRC values, at a logic circuitry via bitwise XOR operations, to determine a CRC value for the data packet, wherein the plurality of stages are to comprise one or more intermediate stages to determine a final CRC value of a portion of the data packet, wherein each of the one or more intermediate stages are to multiply CRC values, corresponding to portions of the data packet, with a different matrix to generate one or more intermediate stage CRC values, and wherein one of the one or more intermediate stage CRC values is to be selected as the final CRC value of the portion of the data packet based on an input offset value.

9. The method of claim 8, further comprising determining a size of the data packet.

10. The method of claim 8, wherein determining the plurality of CRC values comprises determining a CRC value of an initial portion of the data packet.

11. The method of claim 10, wherein accumulating the plurality of CRC values comprises XOR-ing the plurality of CRC values.

12. The method of claim 8, further comprising padding the data packet with one or more zeros to provide the portions of the data packet that have a same size.

13. The method of claim 8, further comprising storing the plurality of cyclic redundancy error (CRC) values in one or more storage units.

14. The method of claim 8, further comprising each of the one or more intermediate stages multiplying the CRC values in parallel.

15. The method of claim 8, further comprising multiplexing the one or more intermediate stage CRC values to select the final CRC value of the portion of the data packet based on the input offset value.

* * * * *